United States Patent
Hu

(10) Patent No.: US 11,024,573 B2
(45) Date of Patent: Jun. 1, 2021

(54) SUBSTRATE STRUCTURE WITH HIGH-DENSITY WIRING AND MANUFACTURING METHOD THEREOF

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 16/736,825

(22) Filed: Jan. 8, 2020

(65) Prior Publication Data

US 2020/0227346 A1 Jul. 16, 2020

Related U.S. Application Data

(60) Provisional application No. 62/789,528, filed on Jan. 8, 2019.

(51) Int. Cl.
| | |
|---|---|
| *H01L 23/498* | (2006.01) |
| *H01L 23/00* | (2006.01) |
| *H01L 21/48* | (2006.01) |
| *H01L 21/683* | (2006.01) |

(52) U.S. Cl.
CPC .... *H01L 23/49838* (2013.01); *H01L 21/4857* (2013.01); *H01L 21/6835* (2013.01); *H01L 23/49822* (2013.01); *H01L 24/16* (2013.01); *H01L 2221/68359* (2013.01); *H01L 2224/16227* (2013.01)

(58) Field of Classification Search
CPC .................................................. H05K 3/4682
See application file for complete search history.

(56) References Cited

U.S. PATENT DOCUMENTS

| | | | | |
|---|---|---|---|---|
| 2010/0326712 | A1* | 12/2010 | Kondo | H05K 3/4635 174/257 |
| 2015/0181703 | A1* | 6/2015 | Tanaka | H05K 1/0298 361/748 |
| 2015/0357276 | A1* | 12/2015 | Shimizu | H05K 3/0023 361/783 |
| 2016/0064254 | A1* | 3/2016 | Hu | H01L 21/486 174/258 |

* cited by examiner

*Primary Examiner* — Xiaoming Liu
(74) *Attorney, Agent, or Firm* — JCIPRNET

(57) ABSTRACT

A substrate structure, for connecting a semiconductor chip, including a high-density redistribution layer (RDL), a low-density RDL, and a middle-density RDL. The high-density RDL includes a fine conductive pattern. The semiconductor chip is disposed on the high-density RDL. The low-density RDL includes a coarse conductive pattern, and is disposed below the high-density RDL and away from the semiconductor chip. A layout density of the fine conductive pattern is denser than that of the coarse conductive pattern. The middle-density RDL is interposed between and electrically connected between the high-density and low-density RDLs. The middle-density RDL includes a middle dielectric layer, a middle conductive pattern disposed on the middle dielectric layer and close to the high-density RDL, and a middle conductive via penetrating the middle dielectric layer and including a top end connected to the middle conductive pattern and a bottom end protruding from a bottom surface of the middle dielectric layer.

11 Claims, 6 Drawing Sheets

SUBSTRATE STRUCTURE WITH HIGH-DENSITY WIRING AND MANUFACTURING METHOD THEREOF

CROSS-REFERENCE TO RELATED APPLICATION

This application claims the priority benefit of U.S. provisional application Ser. No. 62/789,528, filed on Jan. 8, 2019. The entirety of the above-mentioned patent application is hereby incorporated by reference herein and made a part of this specification.

BACKGROUND OF THE INVENTION

1. Field of the Invention

The invention relates to an integrated circuit component, and in particular, to a substrate structure and an electronic device.

2. Description of Related Art

With the vigorous development of the electronic industry, to achieve high density and high efficiency, various electronic products are becoming lighter, thinner, shorter, and smaller. For example, a thin and high-density package structure is usually expected to make an electronic product thinner. Therefore, with an ever decreasing semiconductor chip size and package structure size, how to develop a matching circuit board structure with fine circuitry and coarse circuitry density without greatly increasing manufacturing costs has become an issue to be urgently resolved.

SUMMARY OF THE INVENTION

The invention provides a substrate structure adapted to be connected to a semiconductor chip. The substrate structure includes a high-wiring-density redistribution circuitry, a low-wiring-density redistribution circuitry, and a middle-wiring-density redistribution circuitry. The high-wiring-density redistribution circuitry includes a fine conductive pattern, and the semiconductor chip is adapted to be disposed on the high-wiring-density redistribution circuitry. The low-wiring-density redistribution circuitry includes a coarse conductive pattern and is disposed under the high-wiring-density redistribution circuitry and away from the semiconductor chip. A layout density of the fine conductive pattern is higher than a layout density of the coarse conductive pattern. The middle-wiring-density redistribution circuitry is interposed between the high-wiring-density redistribution circuitry and the low-wiring-density redistribution circuitry and is electrically connected to the high-wiring-density redistribution circuitry and the low-wiring-density redistribution circuitry. The middle-wiring-density redistribution circuitry includes a middle dielectric layer, a middle conductive pattern, and a middle via. The middle conductive pattern is disposed on the middle dielectric layer and is close to the high-wiring-density redistribution circuitry. The middle via runs through the middle dielectric layer and includes a top end connected to the middle conductive pattern and a bottom end protruding from a bottom surface of the middle dielectric layer.

In some embodiments, the high-wiring-density redistribution circuitry further includes a conductive connecting member disposed on a side facing the middle-wiring-density redistribution circuitry and connected to the middle conductive pattern of the middle-wiring-density redistribution circuitry. In some embodiments, the substrate structure further includes an underfill. The underfill is interposed between the high-wiring-density redistribution circuitry and the middle-wiring-density redistribution circuitry, and laterally covers the conductive connecting member of the high-wiring-density redistribution circuitry and the middle conductive pattern of the middle-wiring-density redistribution circuitry. In some embodiments, the substrate structure further includes an adhesive layer. The adhesive layer is interposed between the middle-wiring-density redistribution circuitry and the low-wiring-density redistribution circuitry, and laterally covers the bottom end of the middle via protruding from the bottom surface of the middle dielectric layer. In some embodiments, the middle-wiring-density redistribution circuitry includes a first middle-wiring-density redistribution circuitry and a second middle-wiring-density redistribution circuitry. The first middle-wiring-density redistribution circuitry is interposed between the high-wiring-density redistribution circuitry and the second middle-wiring-density redistribution circuitry, and the second middle-wiring-density redistribution circuitry is interposed between the first middle-wiring-density redistribution circuitry and the low-wiring-density redistribution circuitry. In some embodiments, an adhesive layer is disposed between the first middle-wiring-density redistribution circuitry and the second middle-wiring-density redistribution circuitry to cover the bottom end of the middle via of the first middle-wiring-density redistribution circuitry protruding from the bottom surface of the middle dielectric layer and the middle conductive pattern of the second middle-wiring-density redistribution circuitry connected to the middle via of the first middle-wiring-density redistribution circuitry.

In some embodiments, the hardness of the middle-wiring-density redistribution circuitry is between the hardness of the high-wiring-density redistribution circuitry and the hardness of the low-wiring-density redistribution circuitry. In some embodiments, a layout density of the middle conductive pattern of the middle-wiring-density redistribution circuitry is between the layout density of the fine conductive pattern of the high-wiring-density redistribution circuitry and the layout density of the coarse conductive pattern of the low-wiring-density redistribution circuitry. In some embodiments, the middle-wiring-density redistribution circuitry is a flexible printed circuit (FPC) layer, and the low-wiring-density redistribution circuitry is a printed circuit board (PCB). In some embodiments, a material of the middle via of the middle-wiring-density redistribution circuitry includes a conductive paste.

Based on the above, the substrate structure in the invention includes a high-wiring-density redistribution circuitry, a middle-wiring-density redistribution circuitry, and a low-wiring-density redistribution circuitry stacked together. The high-wiring-density redistribution circuitry is designed to satisfy a requirement on fine line/space of a high bump density of a semiconductor chip, so that the high-wiring-density redistribution circuitry can be directly connected to the semiconductor chip without an additional interposer. In addition, conductive terminals may be disposed on the low-wiring-density redistribution circuitry, and the conductive terminals may be electrically connected to the semiconductor chip through the substrate structure. Since the substrate structure simplifies a structure of a conventional package substrate and an interposer, electrical signals of the semiconductor chip may be more quickly and more reliably transmitted to the conductive terminals through the substrate structure, thereby improving electrical performance.

In order to make the aforementioned features and advantages of the invention more comprehensible, embodiments accompanied with figures are described in detail below.

DESCRIPTION OF THE EMBODIMENTS

Figure 1:
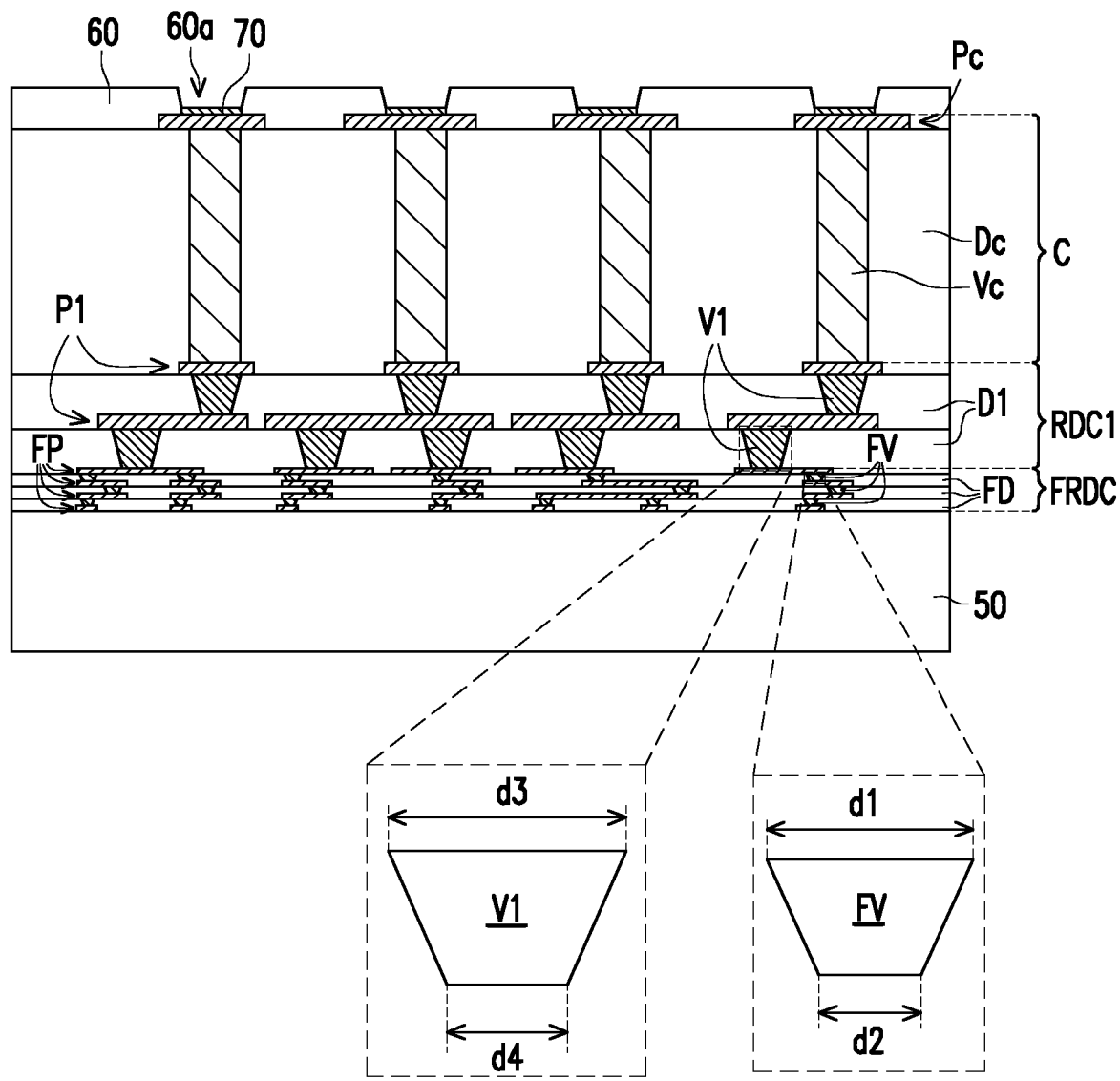
FIG. 1 and FIG. 2 are schematic cross-sectional views of a manufacturing method of a substrate structure according to some embodiments of the invention.
Figure 2:
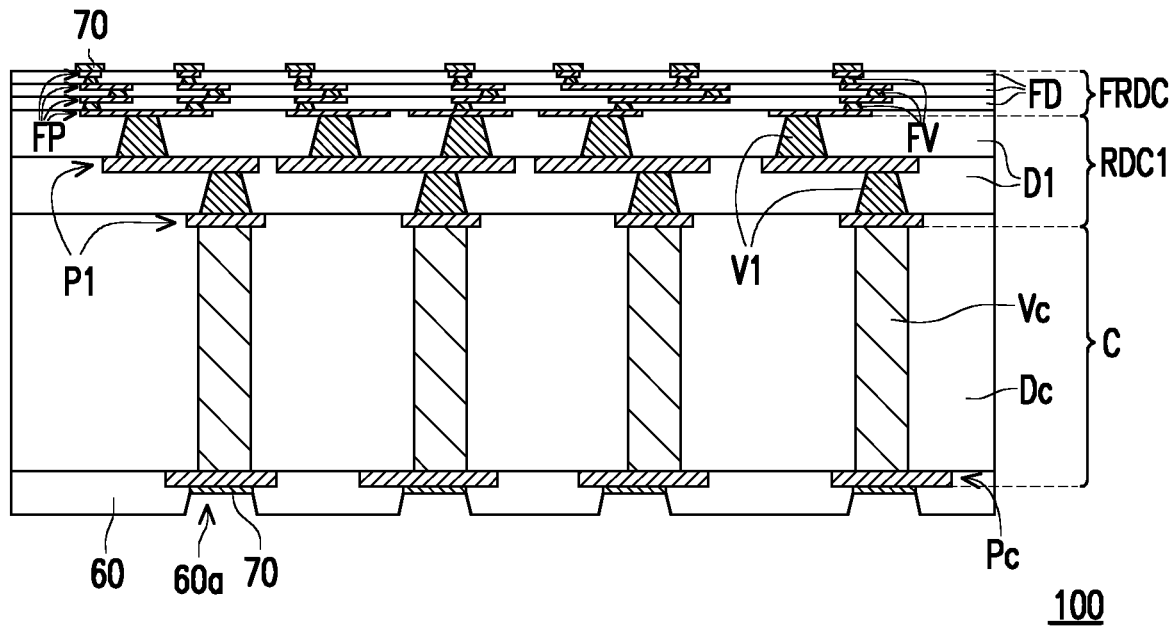

FIG. 1 and FIG. 2 are schematic cross-sectional views of a manufacturing method of a substrate structure according to some embodiments of the invention. Referring to FIG. 1 first, a fine redistribution circuitry FRDC, a first redistribution circuitry RDC1, and a core layer C including a core dielectric layer Dc, a core conductive pattern Pc, and a conductive via Vc are sequentially formed on a temporary substrate 50. Then, a passivation layer 60 is selectively formed on the core layer C, and a surface finishing layer 70 is selectively formed in an opening 60a of the passivation layer 60 and on the core conductive pattern Pc to serve as a protection and enhance solderability.

For example, the fine redistribution circuitry FRDC includes a fine conductive pattern FP, a fine dielectric layer FD, and a fine conductive via FV. In some embodiments, the fine conductive pattern FP is stacked on the fine dielectric layer FD. The fine conductive pattern FP may be formed on the temporary substrate 50 through a deposition process, a lithography etching process, or other suitable processes. The fine conductive pattern FP may be a patterned conductive layer including a fine line/space layout. Then, the fine dielectric layer FD including a plurality of openings may be formed on the temporary substrate 50 through a coating process, a lithography etching process, or other suitable processes, to cover the fine conductive pattern FP. The openings of the fine dielectric layer FD may expose at least a part of the fine conductive pattern FP for an electrical connection. Then, a plurality of fine conductive vias FV may be formed in the openings of the fine dielectric layer FD and connected to the fine conductive pattern FP. In some embodiments, the fine conductive vias FV and the fine conductive pattern FP may be formed in a same process.

The foregoing steps may be repeated to make the fine conductive pattern FP and the fine dielectric layer stacked with each other. In such embodiments, the fine conductive vias FV may be formed between and connected to different layers of fine conductive patterns FP according to a circuit design requirement, to form a multi-layer stacked structure including a fine line/space layout. As shown in FIG. 1, the topmost layer fine conductive pattern FP may be disposed on a fine dielectric layer FD for a further electrical connection.

In some embodiments, before the fine conductive pattern FP is formed, the fine dielectric layer FD may be first formed on the temporary substrate 50. However, a sequence of forming the fine dielectric layer FD and the fine conductive pattern FP is not limited in the invention.

Then, the first redistribution circuitry RDC1 is formed on the fine redistribution circuitry FRDC. For example, a thickness of the fine redistribution circuitry FRDC is less than that of the first redistribution circuitry RDC1. The first redistribution circuitry RDC1 includes a first conductive pattern P1, a first dielectric layer D1, and a first conductive via V1 formed in the first dielectric layer D1. The first conductive via V1 is disposed on the topmost layer fine conductive pattern FP and is electrically connected to the first conductive pattern P1. The first conductive pattern P1 may be electrically connected to the fine conductive pattern FP through the first conductive via V1 and is stacked on the first dielectric layer D1. For example, the first dielectric layer D1 may be formed on the topmost layer fine conductive pattern FP through a deposition process, a lithography etching process, or other suitable processes. The first dielectric layer D1 may include a plurality of openings. Each opening may expose at least a part of the topmost layer fine conductive pattern FP for an electrical connection. Then, a plurality of the first conductive vias V1 may be formed in the openings of the first dielectric layer D1, to be in a direct contact with the fine conductive pattern FP. The first conductive pattern P1 may be formed on the first conductive vias V1, to be electrically connected to the fine redistribution circuitry FRDC. In some embodiments, the first conductive vias V1 and the first conductive pattern P1 are formed in a same process.

The first conductive pattern P1 may be a patterned conductive layer including a coarse line/space layout. That is, the line/space of the fine conductive pattern FP are less than that of the first conductive pattern P1. In a unit area, a layout density of the fine conductive pattern FP is higher than that of the first conductive pattern P1. In some embodiments, the first dielectric layer D1 may be subsequently formed on the first conductive pattern P1 and the openings of the first dielectric layer D1 may expose at least a part of the first conductive pattern P1 to form the first conductive vias V1. The foregoing steps may be repeated to make the first conductive pattern P1 and the first dielectric layer D1 stacked with each other. In such embodiments, as shown in FIG. 1, the first conductive vias V1 may be formed between and connected to the fine conductive pattern FP and the first conductive pattern P1, and formed between and connected to different layers of the first conductive patterns P1 to form a multi-layer redistribution circuitry.

In some embodiments, relative to the fine redistribution circuitry FRDC, the first redistribution circuitry FRDC1 may be regarded as a coarse redistribution circuitry. For example, a size of the fine conductive pattern FP is less than that of the first conductive pattern P1. For example, the line/space of the fine conductive pattern FP are finer than that of the first conductive pattern P1. In some embodiments, a thickness of the fine dielectric layer FD is less than that of the first dielectric layer D1. In some embodiments, each of the fine conductive vias FV is cone-shaped and tends to be narrowed in a direction toward the temporary substrate 50. For example, as shown in FIG. 1, an outer diameter d1 of one end of the fine conductive via FV in a direction facing the first redistribution circuitry RDC1 is greater than an outer diameter d2 of the other end of the fine conductive via FV in a direction away from the first redistribution circuitry RDC1. In some embodiments, each of the first conductive vias V1 is cone-shaped and tends to be narrowed in a direction toward the fine redistribution circuitry FRDC. For example, an outer diameter d3 of one end of the first conductive via V1 in a direction away from the fine redistribution circuitry FRDC is greater than an outer diameter d4 of the other end of the first conductive via V1 in a direction facing the fine redistribution circuitry FRDC. In some embodiments, each of the first conductive vias V1 is of a trapezoid shape with a wide top and a narrow bottom in a cross-sectional view. A size of each of the first conductive vias V1 may be greater than a size of each of the fine conductive vias FV.

Referring to FIG. 1 again, then the core layer C is formed on the first redistribution circuitry RDC1 opposite the fine redistribution circuitry FRDC and is electrically connected to the first conductive pattern P1. The Young's modulus of the core layer C is greater than that of the first redistribution circuitry RDC1. In some embodiments, a material of the core layer C may include pre-preg, ceramics, metal, or other suitable materials. For example, the core layer C includes the core dielectric layer Dc, the core conductive pattern Pc, and the conductive vias Vc. For example, a plurality of conductive vias Vc are buried in the core dielectric layer Dc and are electrically connected to the first redistribution circuitry RDC1. The core conductive pattern Pc may be disposed on the core dielectric layer Dc opposite the first redistribution circuitry RDC1 and is electrically connected to the conductive vias Vc. In some embodiments, the core dielectric layer Dc includes a plurality of openings and the core dielectric layer Dc may be formed on the first redistribution circuitry RDC1. The openings of the core dielectric layer Dc may expose the topmost layer first conductive pattern P1. Then, the conductive vias Vc may be formed in the openings of the core dielectric layer Dc to be connected to the topmost layer first conductive pattern P1. Subsequently, the core conductive pattern Pc may be formed on the core dielectric layer Dc to be connected to the conductive vias Vc. In some embodiments, before the core dielectric layer Dc is formed, the conductive vias Vc may be formed first. However, a sequence of forming the core dielectric layer Dc and the conductive vias Vc is not limited in the invention.

The stiffness of a material is one material characteristic that is taken into consideration, and may be presented by using the Young's modulus. For example, the Young's modulus of the core dielectric layer Dc may be greater than that of the first dielectric layer D1 of the first redistribution circuitry RDC1, and may be greater than that of the fine dielectric layer FD of the fine redistribution circuitry FRDC. That is, the stiffness of a material of the core dielectric layer Dc is greater than the stiffness of a material of the first dielectric layer D1, and is also greater than the stiffness of a material of the fine dielectric layer FD. In some embodiments, a thickness of the first dielectric layer D1 is less than that of the core dielectric layer Dc. A thickness of the core layer C may be determined by using the Young's modulus or the stiffness of the core dielectric layer Dc. However, the thickness of the core layer C is not limited in the invention. For example, a higher stiffness of a material of the core layer C indicates that the thickness of the core layer C may be relatively thin and the stability of the structure can still be maintained. The core layer C may use a material of which the Young's modulus is higher than that of a dielectric layer (for example, the first dielectric layer D1 or the fine dielectric layer FD) in an interconnection structure, to enhance mechanical stability of the package. The coefficient of thermal expansion of a material is another material characteristic that is taken into consideration. In some embodiments, a material of the core dielectric layer Dc may include approximately the same or similar coefficient of thermal expansion (for example, approximately 2.7 ppm) of chips including a silicon substrate installed on the core layer C. In some embodiments, the coefficient of thermal expansion of the first dielectric layer D1 of the first redistribution circuitry RDC1 is greater than the coefficient of thermal expansion of the core dielectric layer Dc.

Then, the passivation layer 60 may be selectively formed on the core layer C opposite the first redistribution circuitry RDC1. The passivation layer 60 may include at least one opening 60a exposing a part of the core conductive pattern Pc, and the part of the core conductive pattern Pc exposed by the opening 60a may serve as an electrical pad. In some embodiments, the core conductive pattern Pc may be used for ball placement. For example, the passivation layer 60 may be a solder mask, or may include inorganic material or another suitable insulation material. In some embodiments, a plurality of surface finishing layers 70 are formed in the opening 60a of the passivation layer 60 and formed on the part of the core conductive pattern Pc exposed by the opening 60a, to prevent the core conductive pattern Pc from being oxidized and enhance solderability.

Referring to FIG. 2, the temporary substrate 50 may be removed from the fine redistribution circuitry FRDC. For example, a separation layer (not shown in the figure) may be peeled by applying additional energy between the fine redistribution circuitry FRDC and the temporary substrate 50, or the temporary substrate 50 may be removed in other suitable processes. After the temporary substrate 50 is removed, the fine conductive pattern FP is exposed, and then the surface finishing layer 70 is selectively formed on the fine conductive pattern FP for protection. At this point, a process of the substrate structure 100 is almost completed. The substrate structure 100 includes several core conductive pattern Pc and fine conductive pattern FP exposed by the passivation layer 60 and the fine dielectric layer FD for an electrical connection.

Figure 3:
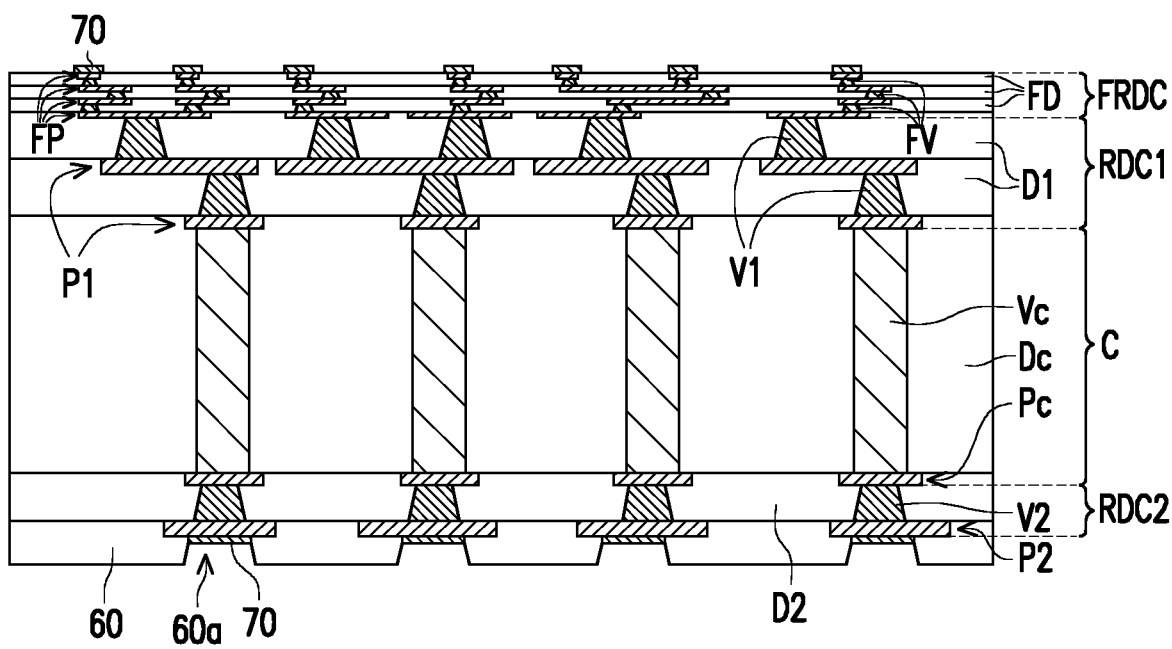
FIG. 3 is a schematic cross-sectional view of a substrate structure according to some embodiments of the invention.

FIG. 3 is a schematic cross-sectional view of a substrate structure according to some embodiments of the invention. Referring to FIG. 3, a substrate structure 200 in FIG. 3 is similar to the substrate structure 100 in FIG. 2, and a difference lies in that: after the core layer C is formed, a second redistribution circuitry RDC2 is formed on the core layer C opposite the first redistribution circuitry RDC1. The second redistribution circuitry RDC2 includes a second conductive pattern P2, a second dielectric layer D2 disposed on the core layer C, and a second conductive via V2 disposed on the core conductive pattern Pc. The second conductive pattern P2 may be stacked on the second dielectric layer D2, and the second conductive pattern P2 may be electrically connected to the core layer C through the second conductive via V2. A forming process of the second redistribution circuitry RDC2 is similar to that of the first redistribution circuitry RDC1. Therefore, the descriptions thereof are omitted herein.

The second dielectric layer D2 and the second conductive pattern P2 may be alternately stacked according to a circuit design requirement, to form a multi-layer redistribution circuitry. In some embodiments, a stack layer number of the first dielectric layer D1 may be greater than that of the second dielectric layer D2. In other embodiments, the stack layer number of the first dielectric layer D1 may be set to be less than or equal to that of the second dielectric layer D2 according to a design requirement. In some embodiments, the stack layer number of the first conductive pattern P1 on the first redistribution circuitry RDC1 is greater than that of the second conductive pattern P2 on the second redistribution circuitry RDC2. In some embodiments, each of the second conductive vias V2 is cone-shaped and tends to be narrowed in a direction toward the core layer C. That is, the second conductive via V2 and the first conductive via V1 are both cone-shaped and tend to be narrowed in a direction toward the fine redistribution circuitry FRDC. For example, an outer diameter of one end of the second conductive via V2 in a direction away from the core layer C is greater than an outer diameter of the other end of the second conductive via V2 in a direction facing the core layer C.

In some embodiments, each of the second conductive vias V2 is of a trapezoid shape with a wide top and a narrow bottom in, for example, a cross-sectional view of FIG. 2. A size of each of the second conductive vias V2 is similar to the size of each of the first conductive vias V1. The size of each of the second conductive vias V2 is greater than the size of each of the fine conductive vias FV. The line/space of the fine conductive pattern FP is finer than the line/space of the second conductive pattern P2. The Young's modulus of the core dielectric layer Dc may be greater than that of the second dielectric layer D2 of the second redistribution circuitry RDC2. A thickness of the second dielectric layer D2 may be less than that of the core dielectric layer Dc. In some embodiments, the coefficient of thermal expansion of the second dielectric layer D2 and the coefficient of thermal expansion of the first dielectric layer D1 are both greater than the coefficient of thermal expansion of the core dielectric layer Dc.

The passivation layer 60 may be selectively disposed on the second redistribution circuitry RDC2 opposite the core layer C. The passivation layer 60 may include at least one opening 60a exposing a part of the second conductive pattern P2. In some embodiments, the surface finishing layer 70 may be separately disposed on the part of the second conductive pattern P2 exposed by the opening 60a. In some embodiments, the surface finishing layer 70 may be formed on the fine conductive pattern FP for protection. In some embodiments, the thickness of the fine redistribution circuitry FRDC is less than that of the second redistribution circuitry RDC2, and the size of the fine conductive pattern FP is less than that of the second conductive pattern P2.

Figure 4:
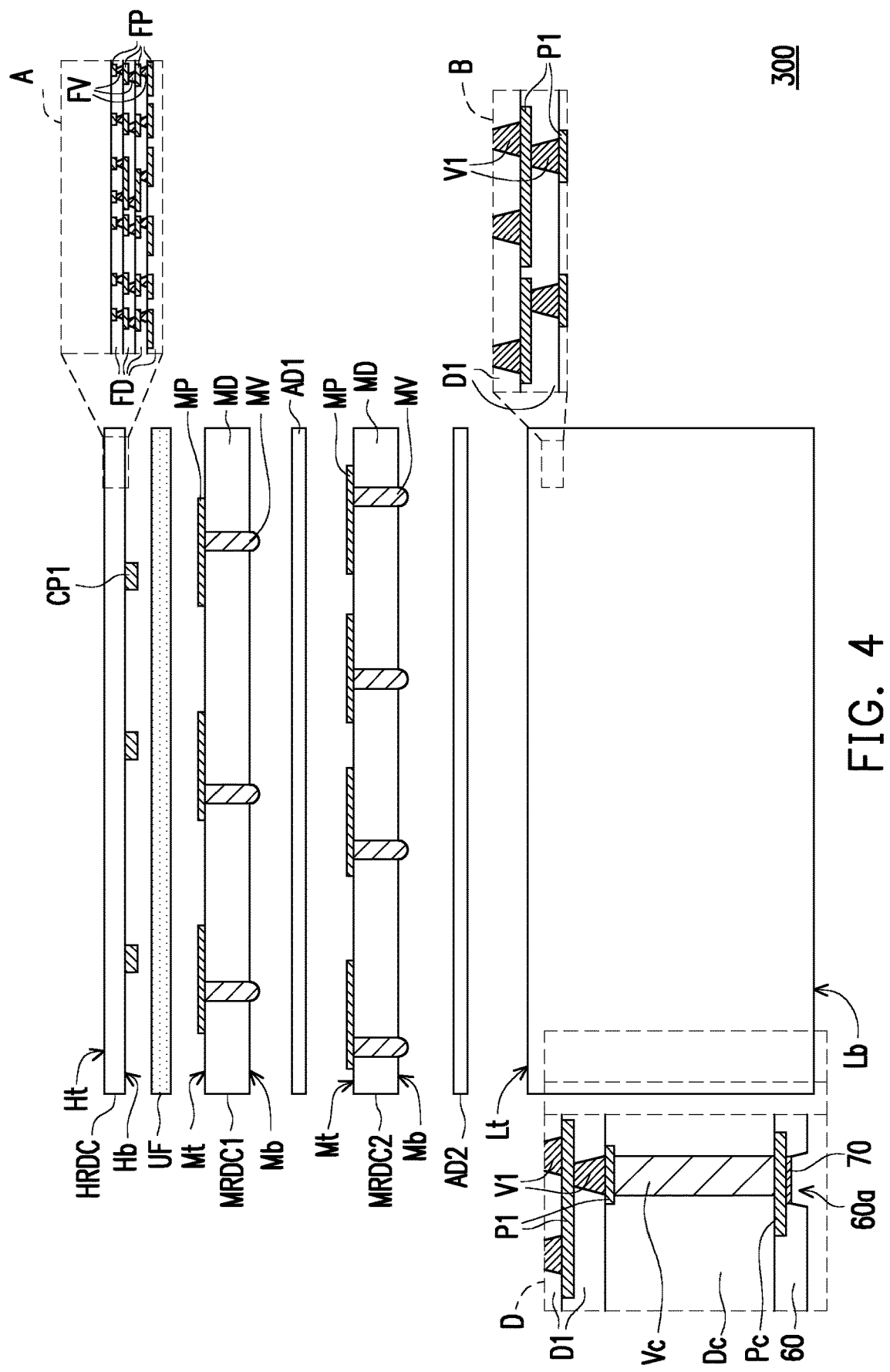
FIG. 4 is a schematic cross-sectional view of a substrate structure in an exploded state according to some embodiments of the invention.
Figure 5:
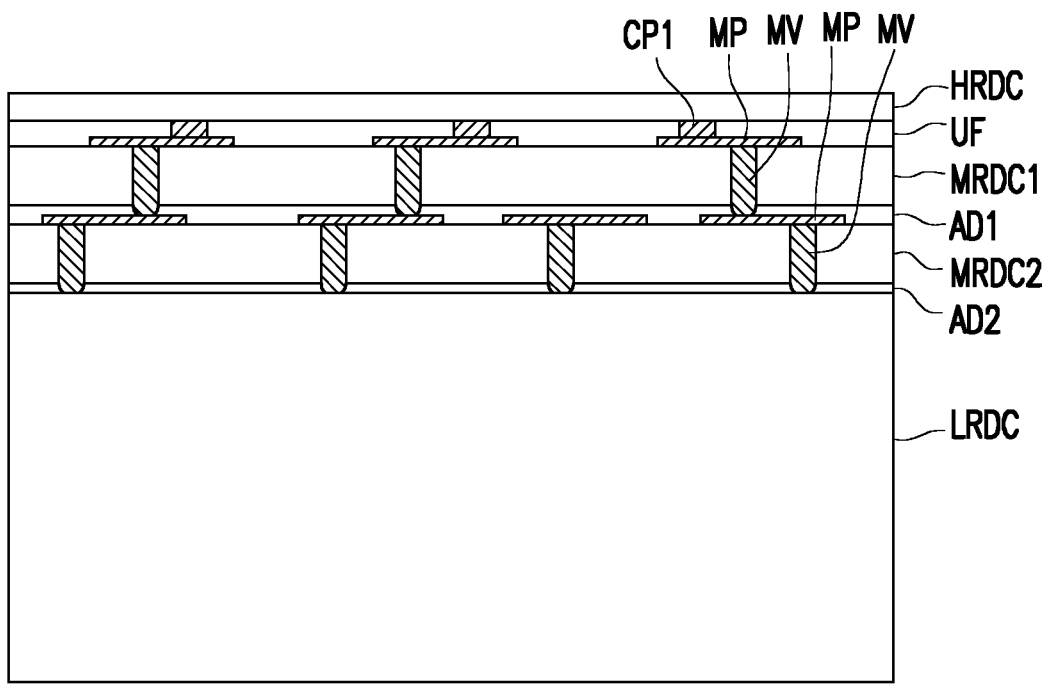
FIG. 5 is a schematic cross-sectional view of the substrate structure in FIG. 4 in a completed state.

FIG. 4 is a schematic cross-sectional view of a substrate structure in an exploded state according to some embodiments of the invention, and FIG. 5 is a schematic cross-sectional view of the substrate structure in FIG. 4 in a completed state. Referring to FIG. 4 and FIG. 5, a substrate structure 300 may be a stacked multi-layer structure, including a high-wiring-density redistribution circuitry HRDC, middle-wiring-density redistribution circuitries MRDC1 and MRDC2, and a low-wiring-density redistribution circuitry LRDC. The hardness of the middle-wiring-density redistribution circuitries MRDC1 and/or MRDC2 is between the hardness of the high-wiring-density redistribution circuitry HRDC and the hardness of the low-wiring-density redistribution circuitry LRDC. For example, the layout density per unit area of the high-wiring-density redistribution circuitry HRDC is the highest among the three circuitries, the layout density per unit area of the low-wiring-density redistribution circuitry LRDC is the lowest among the three circuitries, and the layout density per unit area of the middle-wiring-density redistribution circuitries MRDC1 and MRDC2 is between the layout density per unit area of the high-wiring-density redistribution circuitry HRDC and the layout density per unit area of the low-wiring-density redistribution circuitry LRDC.

The substrate structure 300 may selectively include an underfill UF and adhesive layers AD1 and AD2 to integrate the high-wiring-density redistribution circuitry HRDC, the middle-wiring-density redistribution circuitries MRDC1 and MRDC2, and the low-wiring-density redistribution circuitry LRDC. The thicknesses of the adhesive layers AD1 and AD2 may be the same or different, and the invention is not limited thereto. It should be understood that a quantity of the high-wiring-density redistribution circuitry HRDC, the underfill, the middle-wiring-density redistribution circuitries MRDC1 and MRDC2, the adhesive layers AD1 and AD2, and the low-wiring-density redistribution circuitry LRDC is merely exemplary, and the quantity of the layers may be adjusted according to a product requirement.

In some embodiments, as shown in a dotted box A, the high-wiring-density redistribution circuitry HRDC is similar to the fine redistribution circuitry FRDC in FIG. 1. For example, the high-wiring-density redistribution circuitry HRDC may include a fine dielectric layer FD, a fine conductive pattern FP formed on the fine dielectric layer FD, and a fine conductive via FV penetrating the fine dielectric layer FD to be in touch with the fine conductive pattern FP. Same reference numerals indicate the same elements, so that the descriptions thereof are omitted herein. For example, a semiconductor chip (such as a member indicated by a numeral 10 in FIG. 6) includes high-density input/output (I/O) connecting point, which may be disposed at a top side Ht of a high-wiring-density redistribution circuitry HRDC matching with the density of connecting point for a further electrical connection. The high-wiring-density redistribution circuitry HRDC may satisfy requirements on a high bump density and a fine line/space of the semiconductor chip. In some embodiments, a bottom side Hb of the high-wiring-density redistribution circuitry HRDC is provided with a conductive connecting member CP1 that may be connected to the middle-wiring-density redistribution circuitry MRDC1. For example, the conductive connecting member CP1 may be or include a conductive pad and/or a conductive pillar. The conductive connecting member CP1 may be made of copper, silver, gold, nickel, an alloy thereof, or another suitable conductive material. In some embodiments, the high-wiring-density redistribution circuitry HRDC is a redistribution circuitry used in the field of wafer-level packaging.

In some embodiments, as shown in a dotted box B, the low-wiring-density redistribution circuitry LRDC is similar to the first redistribution circuitry RDC1 in FIG. 1. For example, the low-wiring-density redistribution circuitry LRDC may include a first dielectric layer D1, a first conductive pattern P1 formed on the first dielectric layer D1, and a first conductive via V1 penetrating the first dielectric layer D1 to be in touch with the first conductive pattern P1. For example, the first conductive via V1 of the low-wiring-density redistribution circuitry and the fine conductive via FV of the high-wiring-density redistribution circuitry are both cone-shaped. In some embodiments, the first conductive via V1 of the low-wiring-density redistribution circuitry LRDC and the fine conductive via FV of the high-wiring-density redistribution circuitry HRDC are both tapered in a stacking direction from the low-wiring-density redistribution circuitry LRDC to the high-wiring-density redistribution circuitry HRDC. For example, the low-wiring-density redistribution circuitry LRDC is a PCB. A top side Ht of the low-wiring-density redistribution circuitry LRDC may be connected to the middle-wiring-density redistribution circuitry MRDC2, and conductive terminals (such as a member indicated by a numeral 20 in FIG. 6) may be formed at a bottom side Lb of the low-wiring-density redistribution circuitry LRDC.

In some embodiments, the low-wiring-density redistribution circuitry LRDC may be a substrate including a core layer and a conductive via, and as shown in a dotted box D, a build up film may be formed on two opposite sides of the core layer C in a build-up process to be directly electrically connected to the conductive via. For example, the low-wiring-density redistribution circuitry LRDC further includes a core dielectric layer Dc formed on the first dielectric layer D1, a conductive via Vc penetrating the core dielectric layer Dc, and a core conductive paste Pc disposed on the core dielectric layer Dc and connected to the conductive via Vc, which is, for example, a structure similar to the core layer C in FIG. 1 and the passivation layer 60 disposed on the core layer C. In some embodiments, the low-wiring-density redistribution circuitry LRDC may further include the second redistribution circuitry RDC2 shown in FIG. 3. Same reference numerals indicate the same elements, so that the descriptions thereof are omitted herein. For example, the core dielectric layer Dc may be made of ceramics, glass, or another suitable hard material, to serve as a support of the whole structure.

In some embodiments, the middle-wiring-density redistribution circuitries MRDC1 and MRDC2 are interposed between the high-wiring-density redistribution circuitry HRDC and the low-wiring-density redistribution circuitry LRDC. For example, the middle-wiring-density redistribution circuitry MRDC1 is connected to the bottom side Hb of the high-wiring-density redistribution circuitry HRDC. The middle-wiring-density redistribution circuitry MRDC2 is disposed on a top side Lt of the low-wiring-density redistribution circuitry LRDC, and is disposed on the other side of the middle-wiring-density redistribution circuitry MRDC1 opposite the high-wiring-density redistribution circuitry HRDC. In some embodiments, any one of the middle-wiring-density redistribution circuitries MRDC1 and MRDC2 may be omitted, or the substrate structure 300 may include more than two middle-wiring-density redistribution circuitries.

For example, each one of the middle-wiring-density redistribution circuitries MRDC1 and MRDC2 includes a middle dielectric layer MD, a middle conductive pattern MP disposed on the middle dielectric layer MD, and a middle via MV penetrating the middle dielectric layer MD to be connected to the middle conductive pattern MP. For example, the thickness or hardness of the middle dielectric layer MD may be between that of the fine dielectric layer FD of the high-wiring-density redistribution circuitry HRDC and that of the first dielectric layer D1 of the low-wiring-density redistribution circuitry LRDC. A layout density of the middle conductive pattern MP may be between that of the fine conductive pattern FP of the high-wiring-density redistribution circuitry HRDC and that of the first conductive pattern P1 of the low-wiring-density redistribution circuitry LRDC. A size of the middle via MV may be between that of the fine conductive via FV of the high-wiring-density redistribution circuitry HRDC and that of the first conductive via V1 of the low-wiring-density redistribution circuitry LRDC.

The middle conductive pattern MP is located at a top side Mt of the middle-wiring-density redistribution circuitries MRDC1 and MRDC2 close to the high-wiring-density redistribution circuitry HRDC, and the middle via MV is located at a bottom side Mb of the middle-wiring-density redistribution circuitries MRDC1 and MRDC2. In some embodiments, a material of the middle dielectric layer MD includes polyimide, and a material of the middle conductive pattern MP includes copper. However, the material of the middle dielectric layer MD and the middle conductive pattern MP is not limited thereto. In some embodiments, the middle-wiring-density redistribution circuitries MRDC1 and/or MRDC2 may be an FPC layer. For example, the middle-wiring-density redistribution circuitry MRDC2, close to the top side Lt of the low-wiring-density redistribution circuitry LRDC, may be bonded to the low-wiring-density redistribution circuitry LRDC by the adhesive layer AD2.

In some embodiments, the high-wiring-density redistribution circuitry HRDC may be connected to the middle-wiring-density redistribution circuitry MRDC1 by means of pad-to-pad. For example, the conductive connecting member CP1 of the high-wiring-density redistribution circuitry HRDC is bonded to the middle conductive pattern MP of the middle-wiring-density redistribution circuitry MRDC1 by using a direct bonding of a copper pad to a copper pad. In some other embodiments, the high-wiring-density redistribution circuitry HRDC may be connected to the middle-wiring-density redistribution circuitry MRDC1 by means of pad-to-conductive paste. For example, the conductive connecting member CP1 of the high-wiring-density redistribution circuitry HRDC is bonded to the middle conductive pattern MP of the middle-wiring-density redistribution circuitry MRDC1 by using a direct bonding of a copper pad to a copper paste. It should be understood that the conductive connecting member CP1 of the high-wiring-density redistribution circuitry HRDC may include a conductive pillar, and the pad may be replaced by a bonding of the conductive pillar to a pad/conductive paste. Alternatively, another bonding manner may be used, and this is not limited thereto. In some embodiments, after the conductive connecting member CP1 at the bottom side Hb of the high-wiring-density redistribution circuitry HRDC and the middle conductive pattern MP of the middle-wiring-density redistribution circuitry MRDC1 are bonded together, the underfill UF may be formed in a gap between the bottom side Hb of the high-wiring-density redistribution circuitry HRDC and the top side Mt of the middle-wiring-density redistribution circuitry MRDC1 to laterally cover the conductive connecting member CP1 and the middle conductive pattern MP to enhance bonding degree.

In some embodiments, the middle-wiring-density redistribution circuitry MRDC1 is electrically connected to the middle-wiring-density redistribution circuitry MRDC2 through the middle via MV. The adhesive layer AD1 may be disposed between the bottom side Mb of the middle-wiring-density redistribution circuitry MRDC1 and a top side Mt of the middle-wiring-density redistribution circuitry MRDC2 to laterally cover the middle via My of the middle-wiring-density redistribution circuitry MRDC1 and the middle conductive pattern MP of the middle-wiring-density redistribution circuitry MRDC2. The adhesive layer AD2 may be disposed between a bottom side Mb of the middle-wiring-density redistribution circuitry MRDC2 and the top side Lt of the low-wiring-density redistribution circuitry LRDC to at least laterally cover the middle via MV of the middle-wiring-density redistribution circuitry MRDC2. For example, a material of the middle via MV includes a conductive paste, such as a copper paste, a silver paste, or the like. For example, the middle dielectric layer MD includes a through hole. The conductive paste is formed in the through hole to serve as a middle via MV, and the middle via MV protrudes from a bottom surface of the middle dielectric layer MD for a further electrical connection. For example, the middle via MV of the middle-wiring-density redistribution circuitry MRDC1 may be connected to the middle conductive pattern MP of the middle-wiring-density redistribution circuitry MRDC2, and the middle via MV of the middle-wiring-density redistribution circuitry MRDC2 may be connected to the first conductive pattern P1 of the low-wiring-density redistribution circuitry LRDC. A manufacturing method of the middle-wiring-density redistribution circuitries MRDC1 and MRDC2 will be described in detail with reference to FIG. 7 to FIG. 11.

Figure 6:
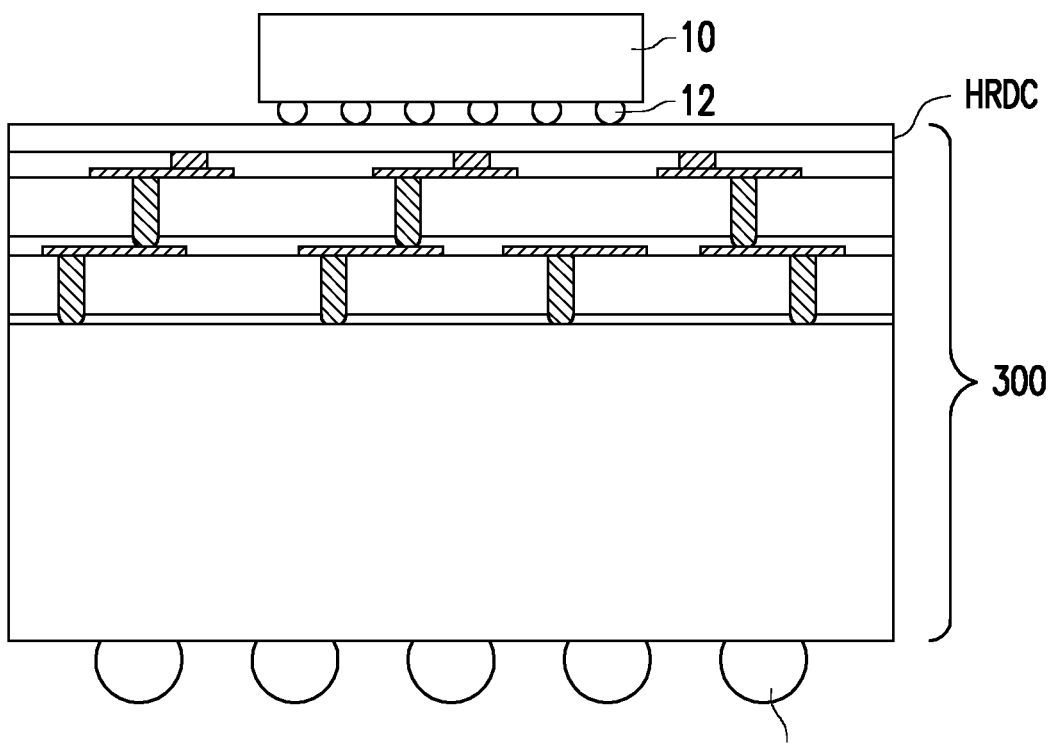
FIG. 6 is a schematic cross-sectional view of an electronic device including a substrate structure according to some embodiments of the invention.

FIG. 6 is a schematic cross-sectional view of an electronic device including a substrate structure according to some embodiments of the invention. Referring to FIG. 6, an electronic device ED includes a substrate structure 300, a semiconductor chip 10 disposed at a top side of the substrate structure 300, and conductive terminals 20 disposed at a bottom side of the substrate structure 300. The substrate structure 300 are similar to the substrate structure 300 described in FIG. 4 and FIG. 5, so that the descriptions thereof are omitted herein. In some embodiments, the semiconductor chip 10 may be disposed on a high-wiring-density redistribution circuitry HRDC of the semiconductor chip 300 through a flip chip process. For example, a plurality of conductive bumps 12 disposed on an active surface of the semiconductor chip 10 may be used for electrically connecting the semiconductor chip 10 to the high-wiring-density redistribution circuitry HRDC. As the semiconductor structure becomes more advanced, to reach a higher requirement on the input/output density and reduce a spacing between conductive bumps 12, the high-wiring-density redistribution circuitry HRDC of the substrate structure 300 can satisfy the requirements on fine line/space of the flip-chip high bump density. In some embodiments, the conductive terminals 20 may be disposed in the opening 60a (referring to FIG. 4) of the passivation layer 60 of the low-wiring-density redistribution circuitry LRDC of the substrate structure 300 through a ball mounting process, to be electrically connected to the substrate structure 10 through the substrate structure 300. Based on the arrangement of the substrate structure 300, there may be a relatively short electrical transmission path between the substrate structure 10 and the conductive terminals 20 to reach a preferred circuit performance. The electronic device ED may be further connected to another electronic device (not shown in the figure) through the conductive terminals 20.

Figure 7:
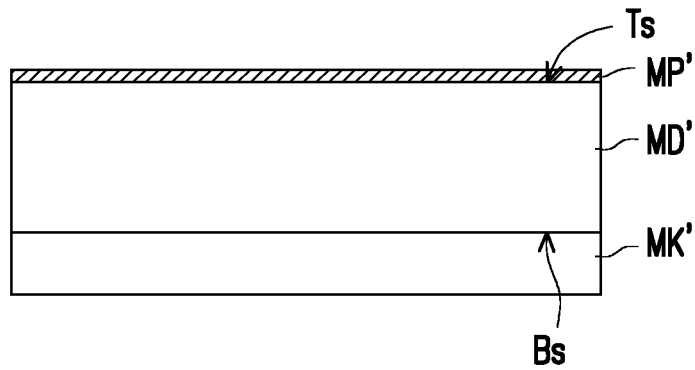
FIG. 7 to FIG. 11 are schematic cross-sectional views of a manufacturing method of a middle-wiring-density redistribution circuitry according to some embodiments of the invention.
Figure 8:
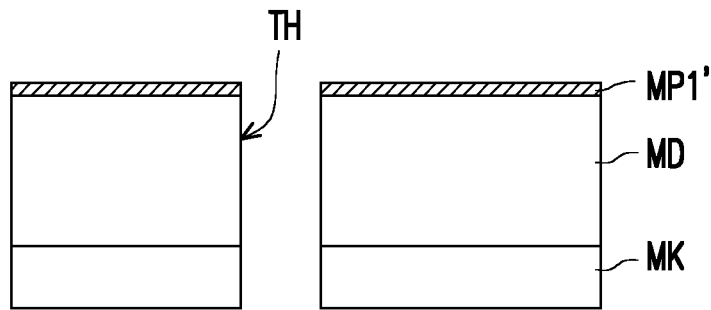

FIG. 7 to FIG. 11 are schematic cross-sectional views of a manufacturing method of a middle-wiring-density redistribution circuitry according to some embodiments of the invention. Referring to FIG. 7 and FIG. 8, a conductive material MP' and a sacrificial material MK' are respectively formed on a top surface Ts and a bottom surface Bs of a dielectric material MD'. For example, the conductive material MP' may be a seed layer or may include conductive material such as copper and copper alloy. The dielectric material MD' may include polyimide, polybenzoazole, benzocyclobutene (BCB), or other suitable dielectric materials. The sacrificial material MK' may include a photo-sensitive material or a photo-resist material for facilitating a subsequent formation process of a through hole. In some embodiments, the sacrificial material MK' may be used as a mask. Then, as shown in FIG. 8, a through hole TH is formed on a structure in FIG. 7. For example, a part of the conductive material MP', the dielectric material MD', and the sacrificial material MK' may be removed through lithography etching, laser drilling, and/or other suitable removal processes to form the through hole TH. After the through hole TH is formed, a first conductive material MP1', a middle dielectric layer MD, and a sacrificial layer MK are formed.

Figure 9:
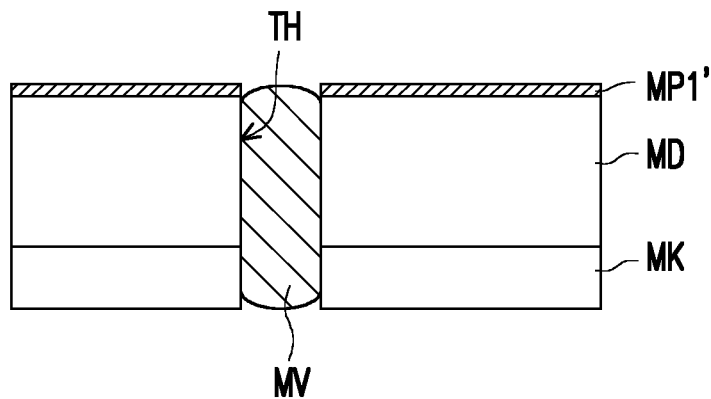
Figure 10:
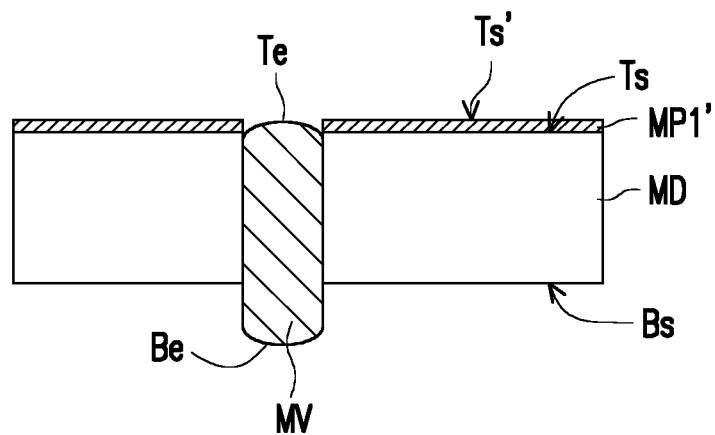

Referring to FIG. 9 and FIG. 10, a middle via MV is formed in the through hole TH. For example, the conductive paste (the copper paste, the silver paste, and the like) is filled in the through hole TH and may be cured through a curing process to form the middle via MV. In some embodiments, after the conductive paste is cured, a bottom end Be and a top end Te of the middle via MV is presented as an arc surface. After the middle via MV is formed, the sacrificial layer MK may be removed to expose a bottom surface Bs of the middle dielectric layer MD. As shown in FIG. 10, the bottom end Be of the middle via MV protrudes from the bottom surface Bs of the middle dielectric layer MD, to facilitate a further electrical connection. The top end Te of the middle via MV close to the first conductive material MP1' is, for example, between the top surface Ts of the middle dielectric layer MD and a top surface Ts' of the first conductive material MP1'.

Figure 11:
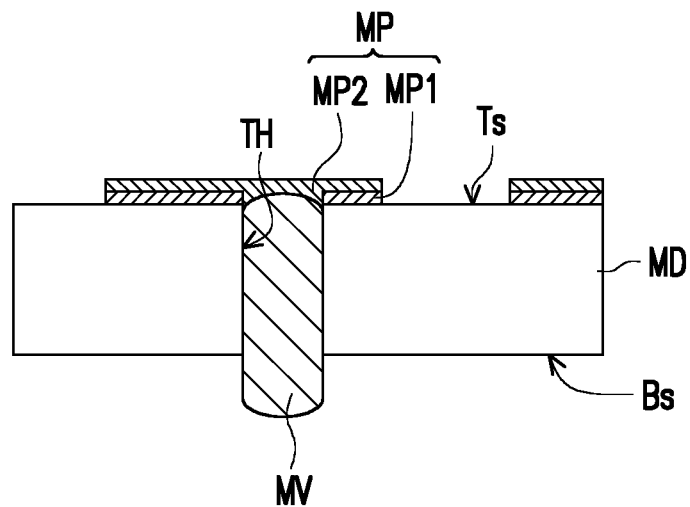

Referring to FIG. 11, a second conductive material is formed on the first conductive material MP1'. Then the first conductive material MP1' and the second conductive material are patterned, to form a middle conductive pattern MP including a first conductive layer MP1 and a second conductive layer MP2. For example, the second conductive material may be formed on the top surface Ts' of the first conductive material MP1' through an electroplating process or another suitable deposition process. Then, the first conductive material MP1' and the second conductive material are patterned through lithography etching or another suitable removal process. The second conductive layer MP2 may be stacked on the first conductive layer MP1 and extends to cover the top end Te of the middle via MV exposed by the through hole TH. For example, after the first conductive material MP1' and the second conductive material are patterned, a part of the top surface Ts of the middle dielectric layer MD is exposed.

Based on the above, the substrate structure in the invention includes a high-wiring-density redistribution circuitry, a middle-wiring-density redistribution circuitry, and a low-wiring-density redistribution circuitry stacked together. The high-wiring-density redistribution circuitry is designed to satisfy a requirement on fine line/space of a high bump density of the semiconductor chip, so that the high-wiring-density redistribution circuitry can be directly connected to the semiconductor chip without an additional interposer. In addition, conductive terminals may be disposed on the low-wiring-density redistribution circuitry, and the conductive terminals may be electrically connected to the semiconductor chip through the substrate structure. Since the substrate structure simplifies a structure of a conventional package substrate and an interposer, electrical signals of the semiconductor chip may be transmitted, more quickly and more reliably, to the conductive terminals through the substrate structure, thereby improving electrical performance.

Although the invention has been described with reference to the above embodiments, the embodiments are not intended to limit the invention. Any person skilled in the art may make changes and modifications without departing from the spirit and scope of the invention. Therefore, the protection scope of the invention should be subject to the appended claims.

What is claimed is:

1. A substrate structure, adapted to be connected to a semiconductor chip, the substrate structure comprising:
   a first redistribution structure, facing the semiconductor chip;

a second redistribution structure, facing away the semiconductor chip; and a core layer, disposed between the first redistribution structure and the second redistribution structure, wherein the first redistribution structure comprising:

a high-wiring-density redistribution circuitry, comprising a fine conductive pattern, wherein the semiconductor chip is adapted to be disposed on the high-wiring-density redistribution circuitry;

a low-wiring-density redistribution circuitry, comprising a first coarse conductive pattern and disposed under the high-wiring-density redistribution circuitry and away from the semiconductor chip, wherein a layout density of the fine conductive pattern is higher than a layout density of the first coarse conductive pattern; and a middle-wiring-density redistribution circuitry, interposed between the high-wiring-density redistribution circuitry and the low-wiring-density redistribution circuitry, and electrically connected to the high-wiring-density redistribution circuitry and the low-wiring-density redistribution circuitry, the middle-wiring-density redistribution circuitry comprising:

a middle dielectric layer;

a middle conductive pattern, disposed on the middle dielectric layer and close to the high-wiring-density redistribution circuitry; and a middle via, penetrating the middle dielectric layer and comprising a top end connected to the middle conductive pattern and a bottom end protruding from a bottom surface of the middle dielectric layer, wherein the second redistribution structure comprising a second coarse conductive pattern, and a stack layer number of the first coarse conductive pattern is greater than a stack layer number of the second coarse conductive pattern, wherein a thickness of the core layer is greater than a thickness of the low-wiring-density redistribution circuitry.

2. The substrate structure according to claim 1, wherein the high-wiring-density redistribution circuitry further comprises:

a conductive connecting member, disposed on a side facing the middle-wiring-density redistribution circuitry and connected to the middle conductive pattern of the middle-wiring-density redistribution circuitry.

3. The substrate structure according to claim 2, further comprising:

an underfill, interposed between the high-wiring-density redistribution circuitry and the middle-wiring-density redistribution circuitry, and laterally covering the conductive connecting member of the high-wiring-density redistribution circuitry and the middle conductive pattern of the middle-wiring-density redistribution circuitry.

4. The substrate structure according to claim 1, further comprising:

an adhesive layer, interposed between the middle-wiring-density redistribution circuitry and the low-wiring-density redistribution circuitry, and laterally covering the bottom end of the middle via protruding from the bottom surface of the middle dielectric layer.

5. The substrate structure according to claim 1, wherein the middle-wiring-density redistribution circuitry comprises a first middle-wiring-density redistribution circuitry and a second middle-wiring-density redistribution circuitry, the first middle-wiring-density redistribution circuitry is interposed between the high-wiring-density redistribution circuitry and the second middle-wiring-density redistribution circuitry, and the second middle-wiring-density redistribution circuitry is interposed between the first middle-wiring-density redistribution circuitry and the low-wiring-density redistribution circuitry.

6. The substrate structure according to claim 5, wherein an adhesive layer is disposed between the first middle-wiring-density redistribution circuitry and the second middle-wiring-density redistribution circuitry to cover the bottom end of the middle via of the first middle-wiring-density redistribution circuitry protruding from the bottom surface of the middle dielectric layer and the middle conductive pattern of the second middle-wiring-density redistribution circuitry connected to the middle via of the first middle-wiring-density redistribution circuitry.

7. The substrate structure according to claim 1, wherein a hardness of the middle-wiring-density redistribution circuitry is between a hardness of the high-wiring-density redistribution circuitry and a hardness of the low-wiring-density redistribution circuitry.

8. The substrate structure according to claim 1, wherein a layout density of the middle conductive pattern of the middle-wiring-density redistribution circuitry is between the layout density of the fine conductive pattern of the high-wiring-density redistribution circuitry and the layout density of the coarse conductive pattern of the low-wiring-density redistribution circuitry.

9. The substrate structure according to claim 1, wherein the middle-wiring-density redistribution circuitry is a flexible printed circuit layer and the low-wiring-density redistribution circuitry is a printed circuit board.

10. The substrate structure according to claim 1, wherein a material of the middle via of the middle-wiring-density redistribution circuitry comprises a conductive paste.

11. The substrate structure according to claim 1, wherein the low-wiring-density redistribution circuitry comprising a first coarse dielectric layer and the second redistribution structure comprising a second coarse dielectric layer, and a stack layer number of the first coarse dielectric layer is greater than a stack layer number of the second coarse dielectric layer.

* * * * *